United States Patent
DeReus et al.

(10) Patent No.: US 10,125,008 B2
(45) Date of Patent: Nov. 13, 2018

(54) ACTUATOR PLATE PARTITIONING AND CONTROL DEVICES AND METHODS

(71) Applicant: Wispry, Inc., Irvine, CA (US)

(72) Inventors: Dana DeReus, Santa Ana, CA (US); Shawn J. Cunningham, Irvine, CA (US); Arthur S. Morris, III, Raleigh, NC (US)

(73) Assignee: WISPRY, INC., Irvine, CA (US)

( * ) Notice: Subject to any disclaimer, the term of this patent is extended or adjusted under 35 U.S.C. 154(b) by 590 days.

(21) Appl. No.: 14/216,213

(22) Filed: Mar. 17, 2014

(65) Prior Publication Data

US 2014/0268482 A1 Sep. 18, 2014

Related U.S. Application Data

(60) Provisional application No. 61/792,201, filed on Mar. 15, 2013.

(51) Int. Cl.
*H01G 5/18* (2006.01)
*B81B 3/00* (2006.01)
*H01G 4/12* (2006.01)

(52) U.S. Cl.
CPC ............ *B81B 3/001* (2013.01); *B81B 3/0051* (2013.01); *B81B 3/0056* (2013.01); *H01G 4/1227* (2013.01); *H01G 5/18* (2013.01); *B81B 2201/0221* (2013.01); *B81B 2203/04* (2013.01); *B81B 2203/053* (2013.01)

(58) Field of Classification Search
CPC ...................................................... H01G 5/16
USPC .................................................. 361/277, 281
See application file for complete search history.

(56) References Cited

U.S. PATENT DOCUMENTS

| 6,362,018 B1 | 3/2002 | Xu et al. |
| 6,426,687 B1 * | 7/2002 | Osborn ................... H01P 1/127 200/181 |
| 6,633,426 B2 | 10/2003 | Shrauger et al. |

(Continued)

FOREIGN PATENT DOCUMENTS

| CN | 1706066 | 12/2005 |
| CN | 1845281 A | 10/2006 |

(Continued)

OTHER PUBLICATIONS

International Search Report for Application No. PCT/US2014/030448 dated Aug. 27, 2014.

(Continued)

*Primary Examiner* — Eric Thomas
(74) *Attorney, Agent, or Firm* — Jenkins, Wilson, Taylor & Hunt, P.A.

(57) ABSTRACT

Devices and methods of operating partitioned actuator plates to obtain a desirable shape of a movable component of a micro-electro-mechanical system (MEMS) device. The subject matter described herein can in some embodiments include a micro-electro-mechanical system (MEMS) device including a plurality of actuation electrodes attached to a first surface, where each of the one or more actuation electrode being independently controllable, and a movable component spaced apart from the first surface and movable with respect to the first surface. Where the movable component further includes one or more movable actuation electrodes spaced apart from the plurality of fixed actuation electrodes.

12 Claims, 9 Drawing Sheets

(56) References Cited

U.S. PATENT DOCUMENTS

| | | |
|---|---|---|
| 7,834,722 B2 | 11/2010 | Millet |
| 9,221,672 B2 | 12/2015 | Shimanouchi et al. |
| 2004/0227428 A1 | 11/2004 | Sinclair |
| 2005/0052821 A1 | 3/2005 | Fujii et al. |
| 2006/0056132 A1 | 3/2006 | Yoshida et al. |
| 2006/0226501 A1 | 10/2006 | Chou |
| 2006/0229045 A1 | 10/2006 | Choi et al. |
| 2011/0315529 A1 | 12/2011 | Segueni et al. |

FOREIGN PATENT DOCUMENTS

| | | |
|---|---|---|
| JP | 2012176445 A * | 9/2012 |
| WO | WO 2012/164725 A1 | 12/2012 |
| WO | WO 2014/145646 | 9/2014 |

OTHER PUBLICATIONS

Chinese Office Action for Application No. 2014800275178 dated Apr. 27, 2016.
Extended European Search Report for Application No. 14764504 dated Oct. 10, 2016.
IPRP and Written Opinion for Application No. PCT/US2014/030448 dated Sep. 15, 2015.
Chinese Office Action for Application No. 2014800275178 dated Dec. 16, 2016.
Chinese Office Action for Application No. 2014800275178 dated Jun. 21, 2017.

* cited by examiner

ACTUATOR PLATE PARTITIONING AND CONTROL DEVICES AND METHODS

PRIORITY CLAIM

The present application claims the benefit of U.S. Provisional Patent Application Ser. No. 61/792,201, filed Mar. 15, 2013, the disclosure of which is incorporated herein by reference in its entirety.

TECHNICAL FIELD

The subject matter disclosed herein relates generally to operations of a micro-electro-mechanical system (MEMS) device. More particularly, the subject matter disclosed herein relates to devices and methods of actuating the movement of a movable component of a MEMS device.

BACKGROUND

Micro-electro-mechanical systems (MEMS) technology has been widely used in the wireless communication industry to improve performance of existing devices based on structure or operational principles. For example, a MEMS tunable capacitor can be developed using micromachining technology and used as a part of a voltage controlled oscillator. As an RF component, a MEMS tunable capacitor can be micro-machined on silicon substrates and be integrated with active circuit components using modified integrated circuit fabrication processes. MEMS tunable capacitors can have the advantages of lower losses and potentially greater tuning range compared to solid-state varactors. The interconnection loss and noise can also be less than those of using off-chip RF components. However, tuning range of a MEMS tunable capacitor can be limited by factors such as parasitic capacitances. In addition, device performance can suffer from factors such as adhesion between movable components and the substrate.

Accordingly, it would be desirable for devices, and methods for MEMS devices to produce a wider tuning range and improve device reliability.

SUMMARY

In accordance with this disclosure, micro-electro-mechanical system (MEMS) devices with partitioned actuation plates and methods for the operation thereof are provided. In one aspect, a configuration for a MEMS device is provided. The MEMS device can comprise a plurality of actuation electrodes attached to a first surface, wherein each of the one or more actuation electrode being independently controllable. The MEMS device can further comprise a movable component spaced apart from the first surface and movable with respect to the first surface, wherein the movable component can comprise one or more movable actuation electrodes spaced apart from the plurality of fixed actuation electrodes.

In another aspect, another configuration for a MEMS device is provided. The MEMS device can comprise a first plurality of fixed actuation electrodes attached to a first surface, wherein each of the plurality of fixed actuation electrode is independently controllable. The MEMS device can further comprise a second plurality of fixed actuation electrodes attached to a second surface, wherein each of the plurality of actuation electrode is independently controllable, and at least one actuation electrode attached to a movable component, wherein the movable component is positioned between the first surface and the second surface and movable with respect to the first or second surface.

In yet another aspect, a method for adjusting a shape of a movable component of a MEMS device is provided. The method can comprise deflecting a movable component by selectively actuating a first subset of a plurality of fixed actuation electrodes using one or more independently controllable voltage driver, wherein the fixed actuation electrodes are independently controllable and attached to a first or second surface. The method can further comprise selectively actuating a second subset of the plurality of the fixed actuation electrodes different than the first subset to adjust a shape of the movable component.

As used herein, the terms actuating an electrode or electrode actuation refer to supplying a bias voltage to an electrode to actuate or energize the electrode.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

Figure 1A:
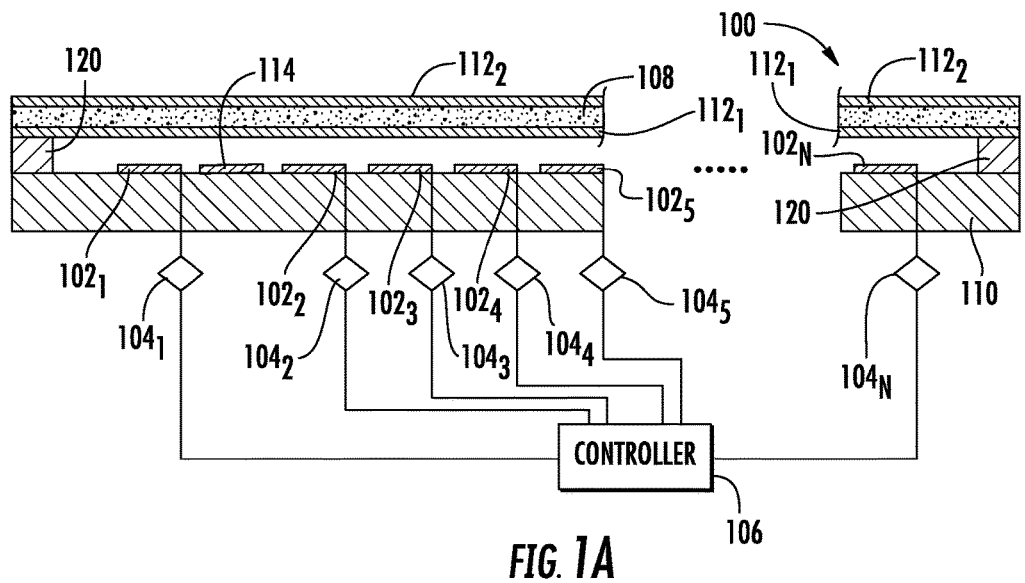
FIGS. 1A and 1B are side views of a MEMS device comprising independently controllable actuation electrodes according to various embodiments of the presently disclosed subject matter.

The present subject matter provides devices and methods for MEMS variable capacitors. In one aspect, the present subject matter provides configurations for MEMS variable capacitors that exhibit improved cycling lifetimes, allow improved capacitor contact, enable a snap pull-in characteristic that can be desirable for stable two-state operation, and reduce actuator stiction, contact forces, charging, breakdown, cycling, and/or hold down. To achieve these benefits, the present subject matter is directed to MEMS devices with independently controllable actuation electrodes and methods for controlling the actuation electrodes for adjusting a shape of a movable component. In some embodiments, the present subject matter provides a multi-state tunable capacitor in which individual bits (e.g., ⅛, ¼, ½ pF) can be integrated into a single, multi-state switch. This tunable capacitor can include a movable component with actuator plates fixed onto the component's surfaces. The actuator plates can be partitioned into multiple sections along the length of the device. The partitioned actuator sections can function as actuation electrodes and vary in sizes. For example, actuator electrodes close to the edges of the movable component can be smaller in size than the other actuator electrodes. Furthermore, the actuation electrodes can be sequentially biased to release or partially release a capacitor section to achieve a desired capacitance value. For example, one or more of the actuation electrodes can be selectively actuated to achieve a variety of capacitor states. To control this selective actuation, multiple high voltage drivers can be provided to bias the actuation electrodes, and a driver controller with multiple output terminals can be provided to control the actuation sequences.

In some embodiments, a subset of actuation electrodes can be selectively actuated to achieve an optimized static beam shape for a desired capacitance. For example, the plurality of actuation electrodes can be selectively energized to deflect the movable component relative to a first or second surface to maximize the capacitance of the device by optimally flattening the capacitor plate or electrode.

In some embodiments, the partitioned actuator plate configuration can further be used to reduce hold down voltage and/or increase hold down lifetime by using area control to maintain the beam in an actuated state rather than using voltage control. For example, all actuation electrodes can be driven or actuated during a pull-in phase, but once the movable component has moved to an actuated (e.g., closed) position, fewer actuation electrodes need to be actuated to hold down the movable component. As such, hold down and pull in of the movable component can both be performed at a reduced voltage compared to conventional systems. Furthermore, actuation electrodes that are grounded (e.g., zero voltage state) can be specifically selected to be those close to a fixed capacitor plate to function as a shield ring against leakage currents, which can help preventing capacitor plate charging.

In some embodiments, a capacitor plate can be configured to function as an actuation electrode. The capacitor plate can assist with the initial pull in, thereby allowing the movable component to be smaller and/or stiffer, and the capacitor plate can be grounded during hold down to avoid charging.

In some embodiments, stiction can be reduced by sequentially actuate the actuation electrodes to achieve a leveraged breaking force. For example, actuation electrodes can be position across the width and/or length of the device. When lifting the movable component away from the first surface (i.e., substrate), actuation electrodes on a first side of the substrate can be released before releasing actuation electrodes on an opposing second side of the substrate to effectively rocking the movable component away from the substrate.

In some embodiments, one or more standoff bumps can be positioned on one or more actuation electrodes. In this configuration, actuation electrodes on one side of a standoff bump can be actuated to pivot the movable component such that a force is exerted to lift the movable component away from actuation electrodes on other side of the standoff bump. This pivoting can provide a number of advantages to the operation of the device. For example, the actuation electrodes can be actuated for increasing a self-actuation release voltage $V_{sar}$ for high power hot switching. It also operates to increase the opening force and thus reduces or eliminates sticking due to charging or surface adhesion. In addition, the present subject matter can be configured to actively increase an average distance between the fixed capacitive electrode and the movable capacitive electrode $D_{avg}$ to raise a self-actuation voltage $V_{sar}$ and/or to lower a minimum capacitance $C_{min}$ the fixed capacitive electrode and the movable capacitive electrode.

In yet a further extension of this concepts disclosed herein, actuation electrodes on either side of a standoff pivot can be operated in an antagonistic manner to support a capacitance on the substrate and lid of a 2-pole switch or to support an antagonistic balance for increased self-actuation voltage $V_{sar}$. For example, antagonistic operation of the actuation electrodes can result in a movable capacitive plate (i.e., on the movable component) being movable to a position that is farther from the fixed capacitive plate than when in a neutral state.

Figure 1B:
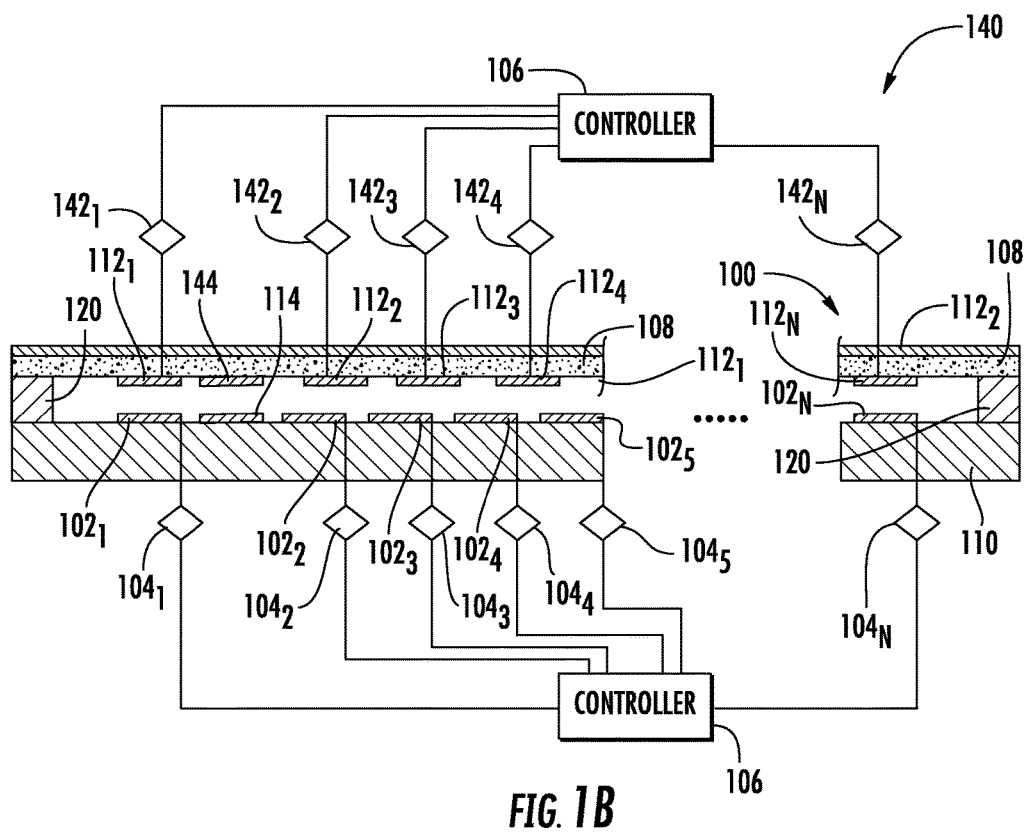

FIG. 1A illustrates a side view of a first exemplary configuration of a MEMS device, generally designated 100, comprising individual actuation electrodes according to various embodiments of the presently disclosed subject matter. As illustrated in FIG. 1A, device 100 can include one or more actuator plates partitioned into a plurality of independently controllable fixed actuation electrodes $102_1$-$102_N$ fixed or attached to a first surface (e.g., substrate 110). In some embodiments, actuation electrodes $102_1$-$102_N$ can be electrically coupled to one or more voltage supply units. For example, a voltage supply unit $104_1$ can be electrically coupled to actuation electrode $102_1$ and configured to provide a bias voltage, where voltage supply unit $104_1$ can comprise a high voltage driver (e.g., a CMOS device) and a voltage control unit (e.g., binary crowbar) positioned between the voltage driver and ground. The voltage control unit can be configured to have multiple states from multiple supply rails and can receive control signals from a controller 106. In a similar fashion, voltage supply units $104_2$-$104_N$ can be electrically coupled to actuation electrodes $102_1$-$102_N$, respectively, as illustrated in FIGS. 1A and 1B. It should be noted that some actuation electrodes may not necessarily be connected to a voltage supply unit and/or any device or component that can be configured to supply a bias voltage to the electrode. In some embodiments, a voltage driver can comprise a CMOS device, or any device that can be configured to supply a bias voltage to an electrode. Furthermore, controller 106 can comprise a plurality of output terminals which can be utilized to supply control signals to voltage control units. In some embodiments, controller 106 can be configured to selectively turn on one or more of the voltage supply units $104_1$-$104_N$. For example, a user can use controller 106 to turn on a subset of voltage supply units (e.g., voltage supply units $104_2$-$104_5$) while leaving the rest (e.g., voltage supply units $104_1$ and $104_6$-$104_N$) in off states (e.g., grounded state). As such, only actuation electrodes electrically coupled to voltage supply units $104_2$-$104_5$ (i.e., actuation electrodes $102_2$-$102_5$) will be selectively actuated, contributing to the bending or deflecting of only part of the movable component (i.e., movable beam 108) towards the first surface. Accordingly, in some embodiments, desirable static beam shapes can be achieved for better device reliability. Furthermore, by selectively actuating and/or de-actuating one or more of actuation electrodes $102_2$-$102_N$, movable beam 108 can be raised, lowered, bent, and/or curved with respect to a capacitor plate 114 in a controlled manner for obtaining specific capacitance values. It should be noted that the location of capacitor plate 114 as illustrated in FIG. 1A is meant to illustrate the general concept disclosed herein and not as a limitation, as capacitor plate 114 can be placed anywhere on substrate 110 along the length and/or width of movable component 108. Furthermore, by adjusting movable beam 108 shape and position in reference to capacitor plate 114, a wide range of capacitance values can be obtained. Accordingly, this configuration enables device 100 to function as a multi-state capacitor while maintaining a device size that is comparable to a single state capacitor.

In some embodiments, one or more actuation plates $112_1$ and $112_2$ can be integrated with movable beam 108 as illustrated in FIG. 1A. For example, actuation plate $112_1$ can be attached to or fixed on one side of movable beam 108 facing substrate 110. Furthermore, movable beam 108 can be anchored or connected to substrate 110 by one or more fixed anchors 120. In some embodiments, anchors 120 can be configured to include one or more signal and/or bias paths connecting and providing controls signals to actuation plates $112_1$ and $112_2$.

In some embodiments, actuation plates $112_1$ and $112_2$ can be partitioned into multiple segments to include one or more capacitor electrodes. Alternatively, actuation plates $112_1$ and $112_2$ can be configured to have one or more capacitive electrodes integrated and spaced apart from capacitor plate 114.

In some embodiments, movable beam 108 and actuation plates $112_1$ and $112_2$ can stay de-actuated (i.e., grounded). In some other embodiments, actuation plates $112_1$ and $112_2$ can be segmented into a plurality of actuation electrodes electrically isolated from each other. The plurality of actuation electrodes can be fixed to the surfaces of movable beam 108 and independently controlled (e.g., biased) by high voltage drivers. For example, actuation plate $112_1$ can be segmented into multiple actuation electrodes fixed to a surface on movable beam 108 facing substrate 110. Each of the multiple actuation electrodes can be independently biased by a voltage supply unit, and each voltage supply unit can be controlled by a controller. In some embodiments, the voltage supply unit can be controlled by controller 106, and voltage control signal paths can be integrated within fixed anchors 120. In particular, controller 106 can be configured to control the voltage supply units to actuate actuation electrodes in a specific manner. For example, a user can program controller 106 to initially actuate all the actuation electrodes. Then, a subset of actuation electrodes located on a first side of movable beam 108 can be turned off (i.e., zero bias), followed by turning off a second subset of actuation electrodes located on an opposing second side of movable beam 108 (or vice versa). This arrangement can effectively create a "rocking" motion to release movable beam 108 from substrate 110.

FIG. 1B illustrates a side view of a second exemplary configuration of a MEMS tunable capacitor device, generally designated 140, comprising individual actuation electrodes according to various embodiments of the presently disclosed subject matter. As illustrated in FIG. 1B, capacitor device 140 can include one or more independently controllable actuation electrodes $112_{11}$-$112_{1N}$ and a capacitor plate 144 fixed or attached on movable beam 108 facing substrate 110, in addition to actuation electrodes $102_1$-$102_N$ fixed to a first surface (e.g., substrate 110). It should be noted that it is possible that some actuation electrodes may not necessarily be connected to a voltage supply unit and/or any device or component that can be configured to supply a bias voltage to the electrode. In some embodiments, actuation electrodes $112_{11}$-$112_{1N}$ can be biased or actuated by a plurality of voltage supply units $142_1$-$142_N$, where voltage supply unit $142_1$-$142_N$ can each include a high voltage driver (e.g., a CMOS device) and a voltage control unit (e.g., binary crowbar) positioned between the voltage driver and ground. Specifically, for example, controller 106 can be configured to control electrical bias voltages supplied to electrodes $112_{11}$-$112_{1N}$ by adjusting the bias voltages provided by voltage supply units $142_1$-$142_N$. Control signal paths and/or electrical conduction paths connecting controller 106 and voltage supply units $142_1$-$142_N$ can be integrated within fixed anchors 120. Furthermore, electrodes $112_{11}$-$112_{1N}$ fixed to substrate 110 can be actuated by voltage supply units $104_1$-$104_N$, also controlled by controller 106. In some embodiments, controller 106 can be configured to actuate electrodes $112_{11}$-$112_{1N}$ to bend or curve movable beam 108 into a desirable static shape, as well as for obtaining specific capacitance values.

In some embodiments, actuation electrodes can be selectively actuated to a high voltage state, a floating state, or a zero voltage state (i.e., grounded state). For example, an actuation electrode (e.g., electrode $102_3$) can be set to a high voltage state (e.g., applying a bias voltage to the electrode and creating an electrostatic field) to generate an attractive force between the electrode and movable beam 108. When the attractive force is strong enough, movable beam 108 can bend and/or snap down onto the electrode. The actuation electrode can also be configured to a zero voltage state, for example, by grounding the electrode, and release movable beam 108 by effectively terminating the electrostatic field.

In some embodiments, an actuation electrode (e.g., electrode $102_4$) can be selectively actuated to a floating state. For example, actuation electrode $102_4$ can be firstly biased with a selected high actuation voltage (e.g., about 40 volts). A DC electrostatic field can be generated from the actuation voltage, and movable beam 108 can be pulled down from the beam's suspended position and come into contact with actuation electrode $102_4$. In a transient state (e.g., while movable beam 108 is coming down onto electrode $102_4$), electrode $102_4$ can be switched to a floating state by creating an open circuit between electrode $102_4$ and voltage supply unit $104_4$. As such, movable beam 108 will come into contact with electrode $102_4$ with less force compared to if electrode $102_4$ was still charged with the selected high actuation voltage. Accordingly, this configuration can improve overall device reliability because less stress will be exerted on movable beam 108.

Figure 2A:
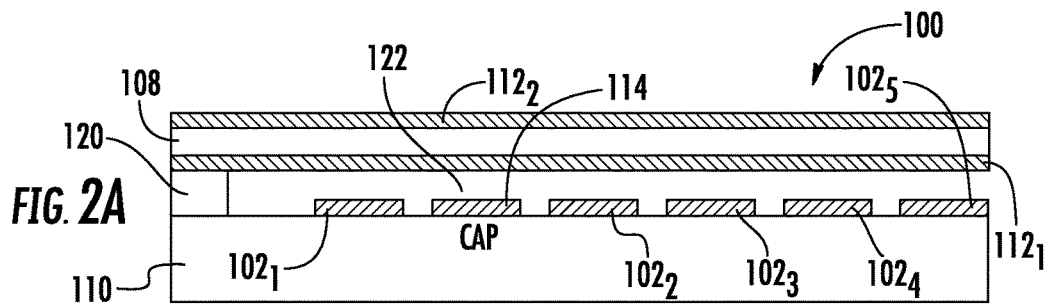
FIGS. 2A to 2E are side views of a MEMS device comprising a movable component under various actuated states according to various embodiments of the presently disclosed subject matter.

FIGS. 2A to 2E illustrate side views of a third exemplary configuration of a MEMS device, generally designated 100, in various actuated states according to embodiments of the presently disclosed subject matter. As illustrated in FIGS. 2A to 2E, device 100 is shown as including a plurality of independently controllable actuation electrodes $102_1$-$102_5$. Although five actuation electrodes are illustrated in this configuration, it should be understood that the principles discussed here would nevertheless apply to other configurations of device 100 (e.g., configurations having a greater or lesser number of actuation electrodes). As illustrated in FIG. 2A, actuation electrodes $102_1$-$102_5$ can be fixed to a first surface (i.e., substrate 110). Movable beam 108 comprising actuation plates $112_1$ and $112_2$ can be suspended above substrate 110 and anchored or fixed to substrate 110 by one or more fixed anchor 120. When actuation electrodes $102_1$-$102_5$ are in unbiased states (i.e., grounded state), movable beam 108 can remain substantially flat and suspended over substrate 110. Accordingly, capacitance value under zero bias voltage (i.e., neutral state) can be determined by the spacing 122 between electrode plate $112_1$ and capacitor plate 114.

Figure 2B:
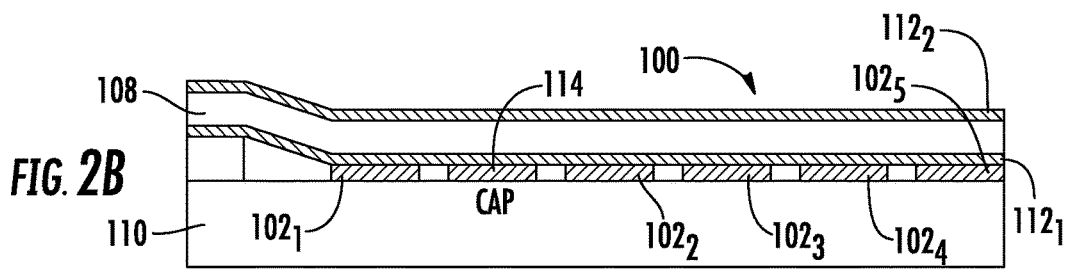

In some embodiments, all actuation electrodes can be actuated to a high voltage state to assist the pull down of movable beam 108. As illustrated in FIG. 2B, actuation electrodes $102_1$-$102_5$ can all be actuated with a positive bias voltage to create an attractive force to cause movable beam 108 to be pulled down onto electrodes $102_1$-$102_5$ and capacitor plate 114. As such, this is when the capacitance value of device 100 can be at its maximum (e.g., 500 fF).

Figure 2C:
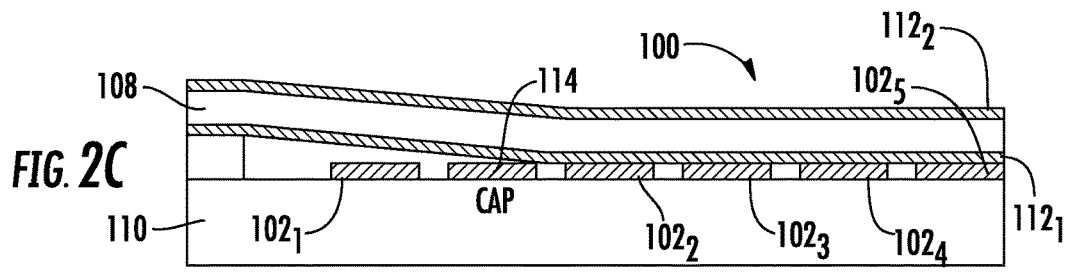
Figure 2D:
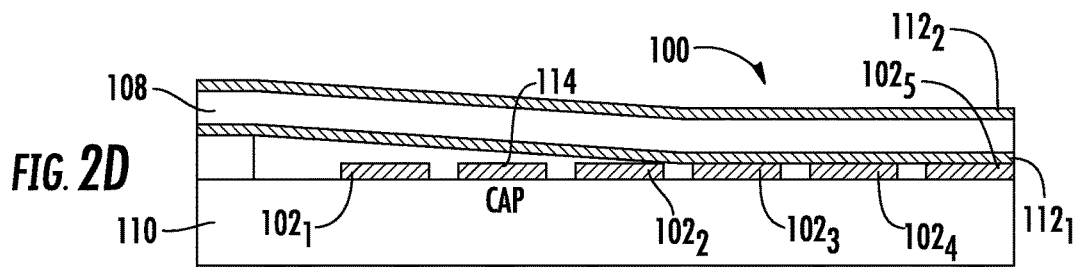

In some embodiments, however, actuation of electrodes $102_1$-$102_5$ can be selectively actuated to obtain specific capacitance values across electrode plates $112_1$ and $112_2$ and capacitor place 114. For example, actuation electrode $102_1$ can be biased to a zero voltage state (i.e., grounded) to terminate the electrostatic force between electrode $102_1$ and movable beam 108. Accordingly, part of movable beam 108 can be released as illustrated in FIG. 2C and gap space between capacitor plate 114 and movable beam 108 can be increased as a result. As such, capacitance value of tunable capacitive device 100 can be reduced (e.g., 250 fF) due to the increase of gap space between capacitor plate 114 and movable beam 108. Similarly, as illustrated in FIG. 2D, movable beam 108 can be further raised by setting actuation electrode $102_1$ to a zero voltage state, and capacitance value of tunable capacitive device 100 can be further reduced (e.g., 125 fF).

Figure 2E:
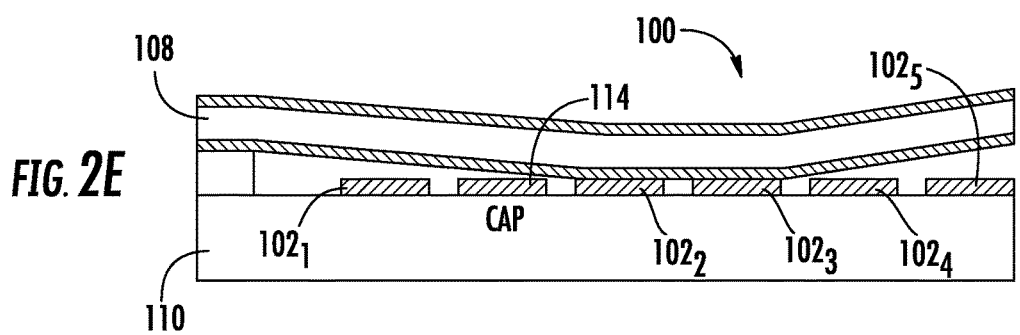

In addition, in some embodiments, actuation electrodes $102_1$-$102_5$ can be selectively actuated in a sequential manner. For example, as illustrated in FIG. 2E, actuation electrodes $102_1$-$102_5$ can firstly all be actuated to pull down movable beam 108. Electrode $102_1$ can be de-actuated to release part of movable beam 108 to one side of capacitor plate 114. Next, actuation electrodes $102_4$, and $102_5$ positioned on an opposing side of capacitor plate 114 can be de-actuated. This actuation/de-actuation sequence can effectively create a "rocking" motion on movable beam 108 to release movable beam 108 away from substrate 110. Accordingly, less actuation voltage may be needed to pull or release movable beam 108 away from substrate 110 and as such, movable beam 108 will experience less force during the pull away or release process and overall device reliability can be improved.

Furthermore, in some embodiments, a subset of actuation electrodes $102_1$-$102_5$ can be selectively actuated to deflect movable beam 108 such that capacitor electrode fixed to movable beam 108 can achieve a desired beam shape with respect to capacitor plate 114. For example, all actuation electrodes $102_1$-$102_5$ can be actuated during a pull-in phase to deflect movable beam 108 toward substrate 110. Once movable beam 108 is moved to a deflected position, fewer electrodes need to be actuated to hold down movable beam 108. For example, in the configuration shown in FIGS. 2A through 2E, only electrode $102_1$ and $102_2$ need to be actuated to maintain a beam shape such that capacitor electrode fixed to movable beam 108 may be optimally flattened against capacitor plate 114. This configuration not only enables device 100 to fine tune its capacitance values, but also reduces hold down voltage and thereby increases device reliability, because fewer actuation electrodes need to be actuated to hold down movable beam 108.

Furthermore, in some embodiments, a subset of actuation electrodes $102_1$-$102_5$ can be selectively de-actuated to improve device performance. For example, actuation electrodes $102_1$ and $102_2$ adjacent to and surrounding capacitor plate 114 can be selectively de-actuated (i.e., grounded) to act as shields against leakage currents and help preventing capacitor plate 114 from charging. This configuration can further reduce stiction between movable component 108 and actuation electrodes $102_1$-$102_5$, and improve device reliability by reducing forces exerted on movable component 108.

Figure 3A:
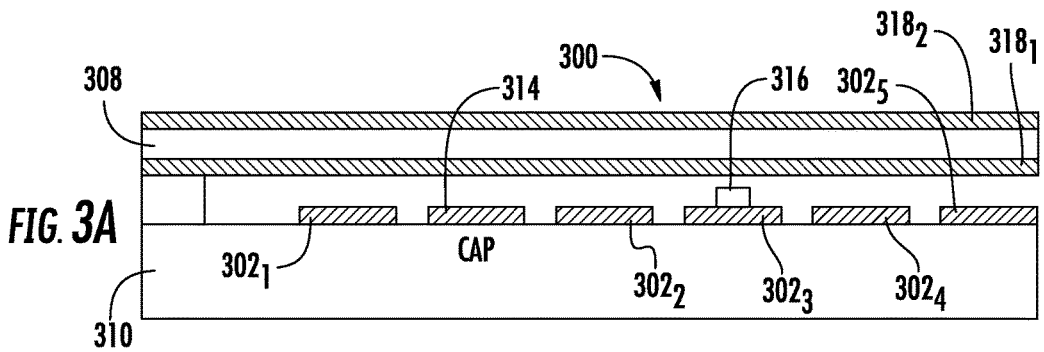
FIGS. 3A to 3D are side views of a MEMS device comprising at least one standoff bump and under various actuated states according to an embodiment of the presently disclosed subject matter.

FIGS. 3A to 3D illustrate side views of fourth exemplary configuration of a MEMS device, generally designated 300, in various actuated states according to embodiments of the presently disclosed subject matter. For illustrative purposes, only a part of device 300 that includes actuation electrodes $302_1$-$302_5$ are shown in the figures. However it should be noted that the principles discussed here would nevertheless apply to alternative configurations of device 300 where actuation electrodes $302_1$-$302_N$ (not shown) can be fixed to substrate 310 along the length and/or width of a movable component 308. As illustrated in FIG. 3A, a plurality of independently controllable actuation electrodes $302_1$-$302_5$ can be fixed to a first surface (i.e., substrate 310), movable beam 308 can remain flat and suspended over substrate 310 when electrodes $302_1$-$302_5$ are in a de-actuated (i.e., grounded) state. A capacitor electrode 314 can also be fixed to substrate 310, and it should be noted that the location of capacitor plate 314 as illustrated in FIG. 3A is meant to illustrate the general concept and not as a limitation, as capacitor plate 314 can be placed anywhere on substrate 310 along the length and/or width of movable component 308. Furthermore, a standoff bump 316 can be fixed to one or more of the actuation electrodes, for example to electrode $302_3$ as illustrated in FIG. 3A. It should be noted that more than one standoff bumps can be fixed to any of the actuation electrodes, and in some embodiments, standoff bumps can also be fixed to movable beam 308. Movable beam 308 can comprises actuation plates $318_1$ and $318_2$ on either side of the beam. In some embodiments, actuation plates $318_1$ and $318_2$ can be partitioned into multiple segments to include one or more capacitor electrodes. Furthermore, actuation plates $318_1$ and $318_2$ can be configured to have one or more capacitive electrode integrated and spaced apart from capacitor plate 314.

Figure 3B:
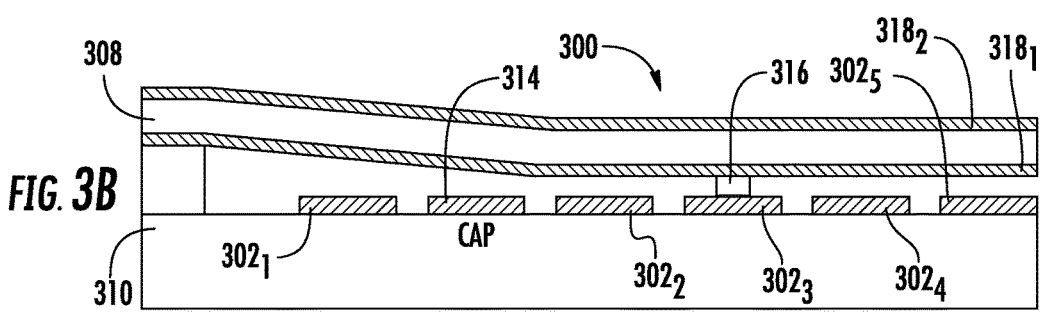
Figure 3C:
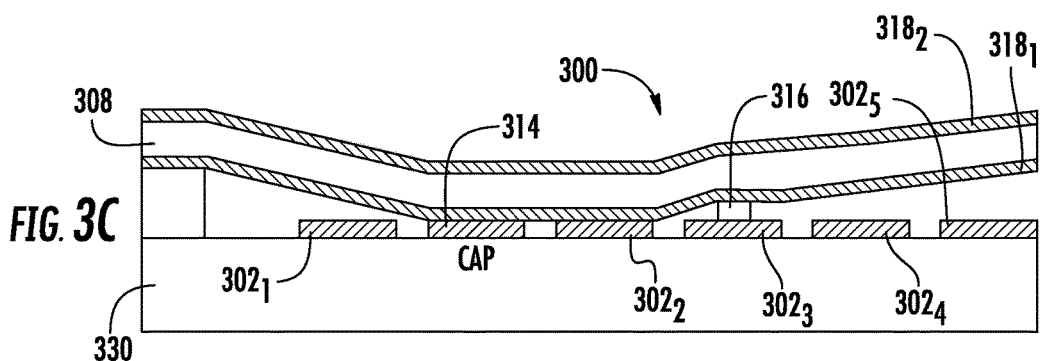
Figure 3D:
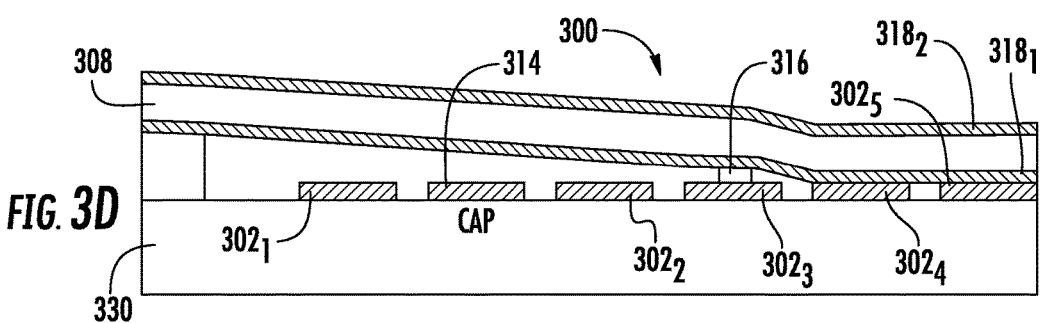

In some embodiments, standoff bump 316 can effectively increase an average distance between one or more of capacitor plate 314 and/or actuation electrodes $302_1$-$302_5$ and movable component 308. In addition, as illustrated in FIGS. 3B to 3D, when actuation electrodes $302_1$-$302_5$ are being selectively actuated and movable component 308 is pulled towards substrate 310, standoff bump 316 can function as a pivot to movable component 308. For example, as illustrated in FIG. 3C, actuating electrode $302_2$ can exert a force to lift a respective portion of movable component 308 away from actuation electrodes positioned on the other side of standoff bump 316 (e.g., actuation electrodes $302_4$ and $302_5$). Likewise, as illustrated in FIG. 3D, actuation electrodes $302_4$ and $302_5$ can be actuated to exert a force to lift a respective portion of movable component 308 away from actuation electrode $302_2$ and capacitor plate 314. This configuration can provide a number of advantages to the operations of device 300. For example, for high power hot switching operations, selectively actuating electrodes around standoff bump 316 can effectively increase a self-actuation release voltage $V_{sar}$ for device 300. Furthermore, stiction between movable beam 108 and actuation electrodes $302_1$-$302_5$ can be reduced because the opening force exerted on movable beam 108 can be effectively increased due to pivoting. In addition, a minimum capacitance value $C_{min}$ of device 300 can be effectively lowered due to a decrease in average distance between actuation electrodes $302_1$-$302_5$ and movable beam 108.

Figure 4:
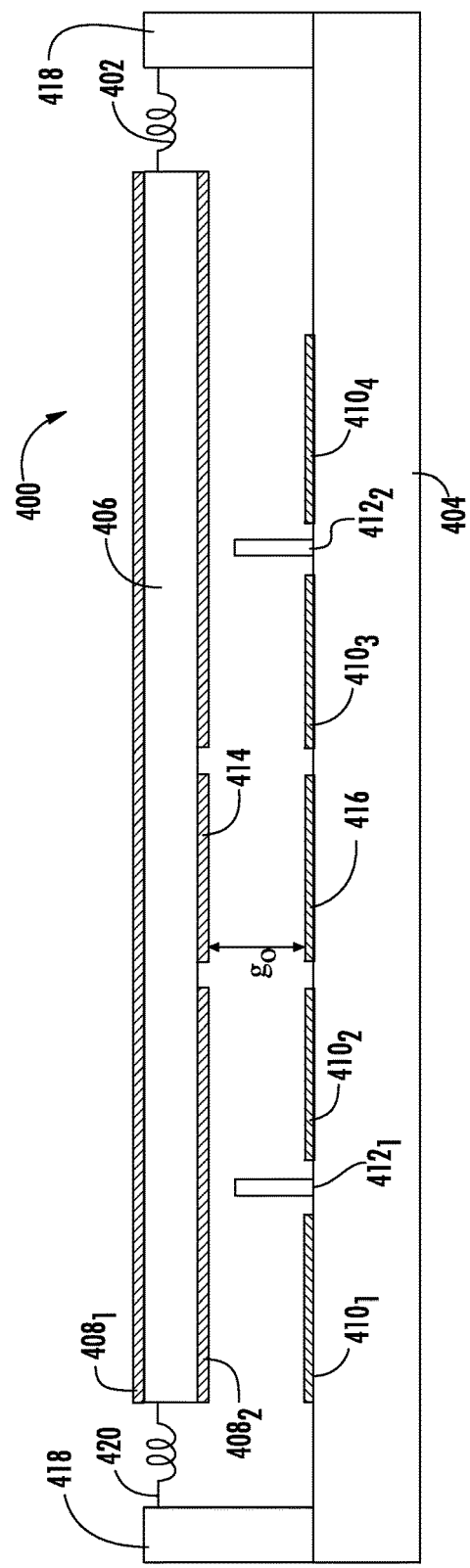
FIG. 4 is a side view of a MEMS device comprising one or more standoff pivots in an un-actuated state in accordance to embodiments of the presently disclosed subject matter.

In some embodiments, antagonistic operation of actuation electrodes around a standoff bump can be further applied to standoff pivots fixed to a surface. As illustrated in FIG. 4, a fifth exemplary configuration of a MEMS device, generally designated 400, can include one or more standoff pivots, such as standoff pivots $412_1$ and $412_2$, fixed to a first surface (i.e., substrate 404). Standoff pivots $412_1$ and $412_2$ can be comparatively longer in length than standoff bump 316 (see FIGS. 3A-3D) but shorter than a gap length $g_o$, where $g_o$ can be the gap length between movable component 406 and actuation electrodes $410_1$-$410_4$ when electrodes $410_1$-$410_4$ are under zero biases (i.e., de-actuated or grounded). As such, standoff pivots $412_1$ and $412_2$ do not come into contact with movable component 406 when actuation electrodes $410_1$-$410_4$ are de-actuated. It should be noted that the placements of standoff pivots $412_1$ and $412_2$ as illustrated in FIGS. 4-6 are meant to illustrate the subject matters disclosed herein and not as a limitation.

In some embodiments, movable component 406 can include actuation electrodes $408_1$-$408_3$ and a capacitor plate 414. Device 400 can also include anchors 418 connecting substrate 404 and movable component 408 through springs 402 and 420. It should be noted that springs 402 and 420 can be substituted with other components with similar elasticity. In some embodiments, springs 402 and 420 can be different types of springs or equivalent device components with different stiffness values. In some embodiments, actuation electrodes $410_1$-$410_4$ and $408_1$-$408_3$ can each be biased with a high voltage driver (not shown) and independently controlled by a controller (not shown) with multiple output terminals.

Figure 5:
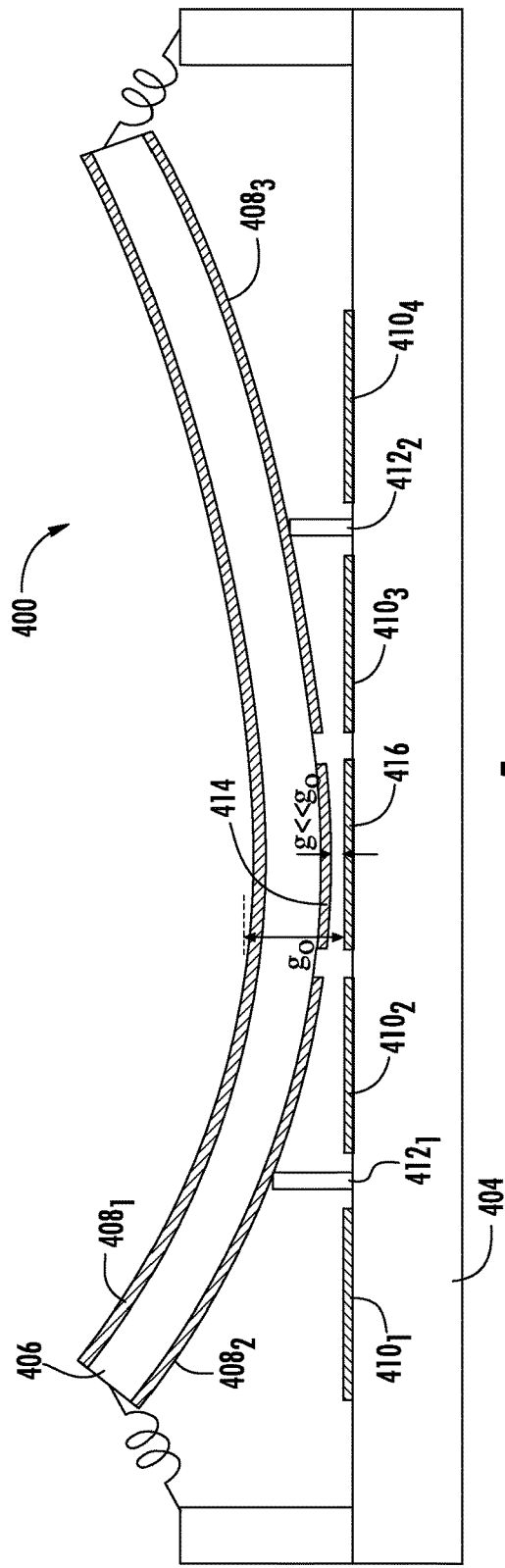
FIG. 5 is a side view of a MEMS device comprising one or more standoff pivots in an actuated state in accordance to embodiments of the presently disclosed subject matter.

FIG. 5 illustrates a side view of MEMS device 400 in a first actuated state according to embodiments of the presently disclosed subject matter. As illustrated in FIG. 5, actuation electrodes $410_2$ and $410_3$ can be biased to a high voltage state and actuation electrodes $410_1$ and $410_4$ can be configured to a zero voltage state (e.g., grounded). Accordingly, standoff pivots $412_1$ and $412_2$ can effectively function as pivots such that forces can be exerted to pull movable component 406 down to actuation electrodes $410_2$ and $410_3$ and lift movable component 406 away from actuation electrodes $410_1$ and $410_4$. As such, due to the pivoting of movable component 406 on standoff pivots $412_1$ and $412_2$, less actuation voltage can be used to pull movable component 406 down to substrate 404.

Figure 6:
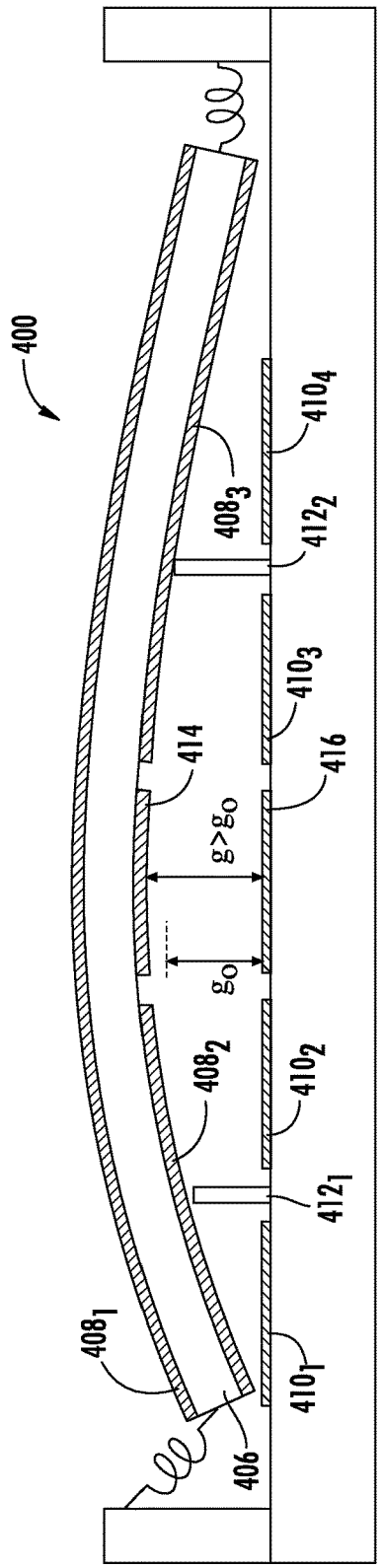
FIG. 6 is a side view of a MEMS device comprising one or more standoff pivots in another actuated state in accordance to embodiments of the presently disclosed subject matter.

FIG. 6 illustrates a side view of MEMS device 400 in a second actuated state according to embodiments of the presently disclosed subject matter. As illustrated in FIG. 6, actuation electrodes $410_1$ and $410_4$ can be biased to a high voltage state and actuation electrodes $410_2$ and $410_3$ can be configured to an un-actuated and/or a zero voltage state (e.g., grounded). Accordingly, standoff pivots $412_1$ and $412_2$ can again effectively function as pivots such that forces can be exerted to lift up movable component 406 away from actuation electrodes $410_2$ and $410_3$ and pull movable component 406 down to actuation electrodes $410_1$ and $410_4$. Accordingly, due to the pivoting of movable component 406 on standoff pivots $412_1$ and $412_2$, the gap space g between fixed capacitor plate 416 and movable capacitor plate 414 can be increased to be larger than stationary gap space $g_o$, and minimum capacitance value of device 400 can be lowered. Furthermore, due to the pivoting effect, an opening force between movable component 406 and actuation electrodes $410_2$ and $410_3$ and capacitor plate 416 can be increased, and as such, self-actuation voltage $V_{sar}$ of device 400 can be increased and stiction due to charging or surface adhesion can be reduced or eliminated.

Figure 7A:
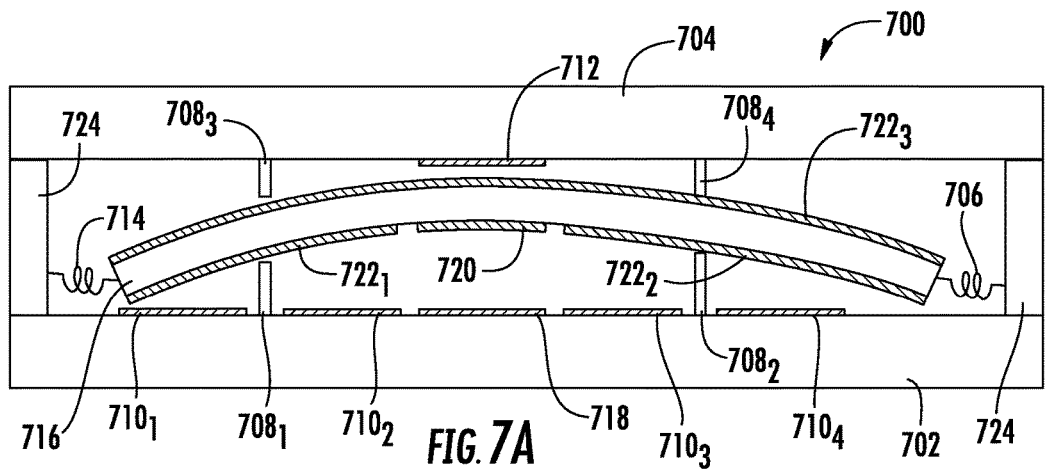
FIGS. 7A to 7C are side views of a MEMS device comprising a movable component positioned between two surfaces and under various actuated states in accordance to embodiments of the presently disclosed subject matter.
Figure 7B:
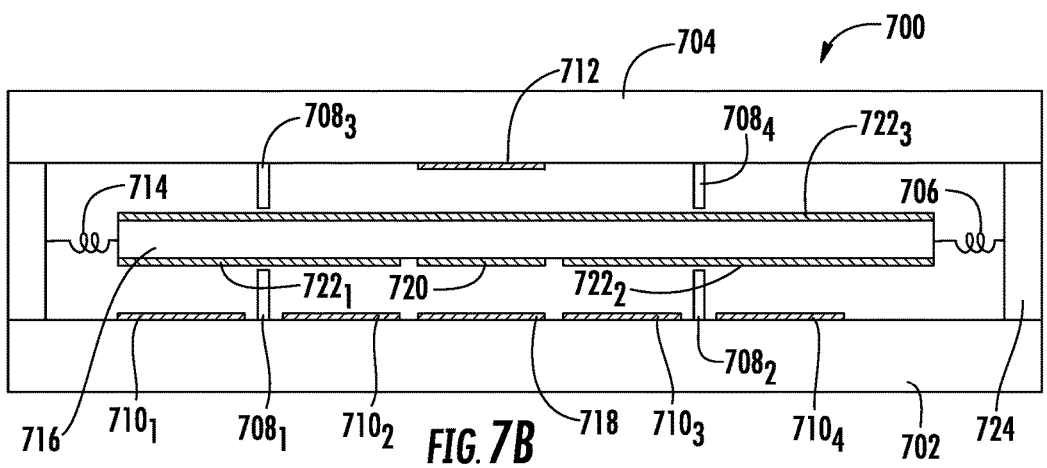
Figure 7C:
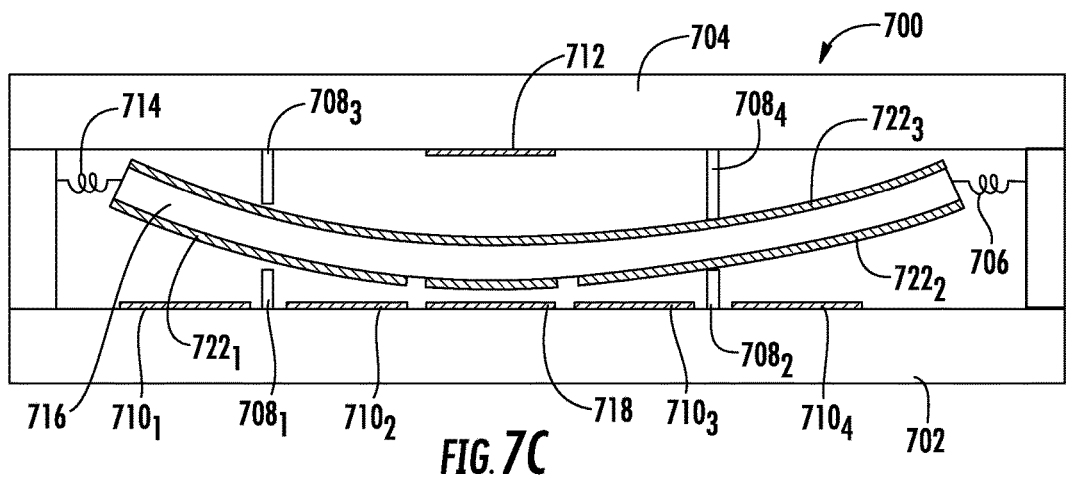

In some embodiments, actuator plate partitions on either side of a standoff pivot can be operated in an antagonistic manner to support a capacitance on a substrate and lid or a two-pole switch or to support an antagonistic balance for increased self-actuation voltage $V_{sar}$. FIGS. 7A to 7C illustrate a sixth exemplary configuration for a MEMS device, generally designated 700, including a first surface (i.e., substrate 702) spaced apart from a second surface (i.e., lid 704) and a movable component 716 positioned there between (i.e., suspended between substrate 702 and lid 704). Device 700 can further include standoff pivots extending from one or more of substrate 702, lid 704, and/or movable component 716. In the particular configuration illustrated in FIGS. 7A through 7C, for example, a first set of standoff pivots $708_1$ and $708_2$ is fixed to substrate 702, and a second set of standoff pivots $708_3$ and $708_4$ is fixed to substrate lid 704. A capacitor plate 718 can be fixed to substrate 702, another capacitor plate 712 can be fixed to lid 704, and yet another capacitor plate 720 can be fixed to movable component 716. Device 700 can further include a plurality of actuator plates partitioned into a plurality of actuation electrodes with various dimensions fixed to one or more surfaces. For example, a first plurality of actuation electrodes $710_1$-$710_4$ can be fixed to substrate 702 and a second plurality of actuation electrodes $722_1$-$722_3$ can be fixed to movable component 716. It should be noted that the exact number of actuation electrodes as illustrated in FIGS. 7A to 7C are meant to illustrate the subject matter disclosed herein and not as a limitation. Two fixed anchors 724 can be positioned between substrate 702 and lid 704, and movable component 716 can be anchored or fixed to one or more of anchors 724 through two springs 706 and 714. It should be noted that springs 706 and 714 can have different stiffness values and can be replaced by other functional equivalent device components or structures.

In some embodiments, as illustrated in FIG. 7A, actuation electrodes $710_1$ and $710_4$ can be biased to a high voltage state and actuation electrodes $710_2$ and $710_3$ can be configured to a zero voltage state (e.g., grounded). Furthermore, actuation electrode $722_3$ may be partitioned into multiple segments to include one or more capacitor electrodes. Alternatively, actuation plate $722_3$ can be configured to have one or more capacitive electrode integrated and spaced apart from capacitor plate 712. Accordingly, standoff pivots $708_1$ through $708_4$ can effectively function as pivots such that forces can be exerted to lift up movable component 716 away from actuation electrodes $710_2$ and $710_3$ and capacitor plate 718 and pull movable component 716 down to actuation electrodes $710_1$ and $710_4$. Accordingly, due to the pivoting of movable component 716 on standoff pivots $708_1$ through $708_4$ as illustrated in FIG. 7A, because not every actuation electrode needs to be actuated, less actuation voltage may be needed to lift movable component 716 away from capacitor plate 718 and closer to capacitor plate 712.

Furthermore, as illustrated in FIG. 7C, actuation electrodes $710_2$ and $710_3$ can be biased to a high voltage state and actuation electrodes $710_1$ and $710_4$ can be configured to a zero voltage state (e.g., grounded). Accordingly, standoff pivots $708_1$ through $708_4$ can again effectively function as pivots such that forces can be exerted to lift up movable component 716 away from actuation electrodes 710₁ and 710₄ and pull movable component 716 down to actuation electrodes 710₂ and 710₃. Accordingly, due to the pivoting of movable component 716 on standoff pivots 708₁ through 708₄, not every actuation electrode within device 700 needs to be actuated to bring movable component 716 closer to capacitor plate 718 and away from capacitor plate 712. As such, as illustrated in FIGS. 7A to 7C, selectively actuating actuation electrodes 710₁-710₄ around standoff pivots 708₁-708₄ can cause movable component 716 to deflect between capacitor plate 718 and 712, effectively increase the capacitance tuning range of device 700 compared to a two plated system. Furthermore, due to the pivoting effect, an opening force between movable component 716 and capacitor plates 712, 718 can be increased, and as such, self-actuation voltage $V_{sar}$ can be increased and stiction due to charging or surface adhesion can be reduced or eliminated.

Figure 8A:
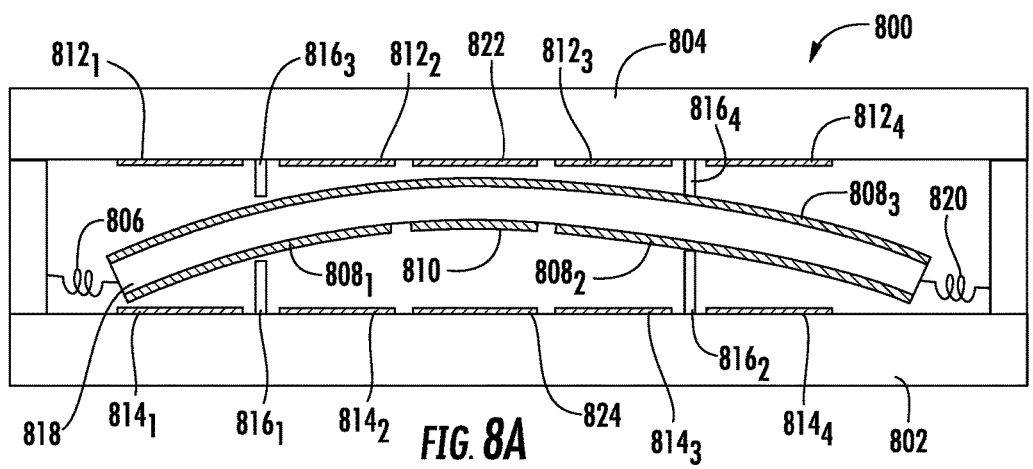
FIGS. 8A to 8C are side views of a MEMS device with independently controllable actuation electrodes fixed to a first and a second surface and under various actuated states in accordance to embodiments of the presently disclosed subject matter.
Figure 8B:
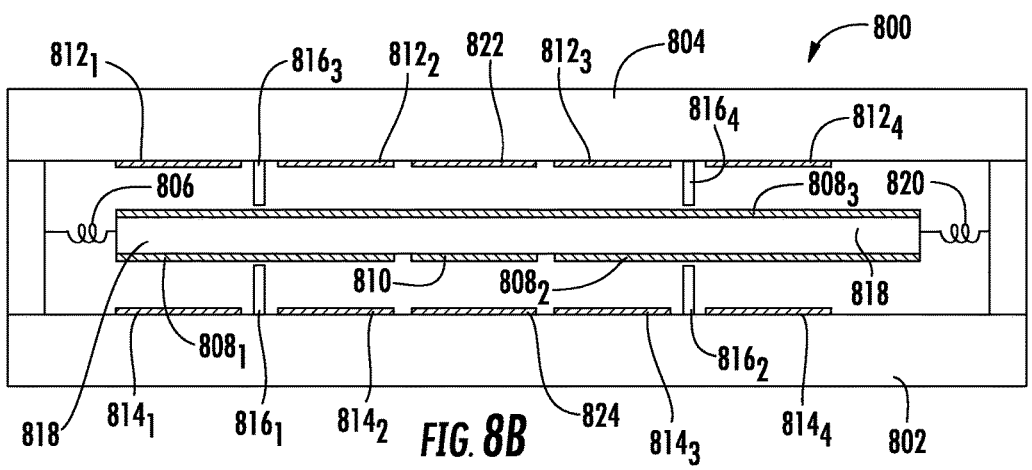
Figure 8C:
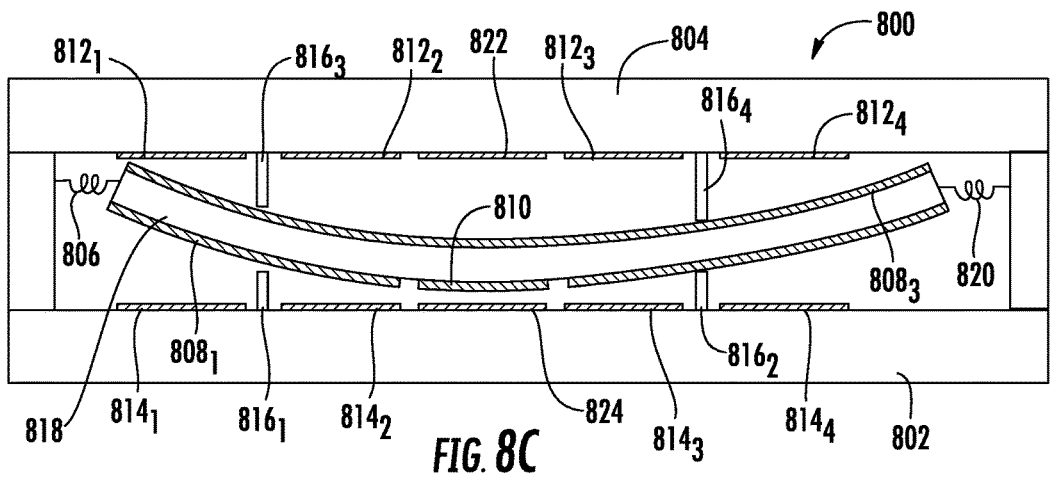

In some embodiments, further actuation electrodes can be fixed to a second surface to assist the deflection and/or movement of a movable component. FIGS. 8A to 8C illustrate a seventh exemplary configuration of a MEMS device, generally designated 800, with actuation electrodes 812₁-812₄ fixed to a second surface (i.e., lid 804). Similar to other embodiments previously presented, a movable component 818 can be positioned between a first surface (i.e., substrate 802) and a second surface (i.e., lid 804) and connected to two fixed anchors by springs 806 and 820. In addition to actuation electrodes 814₁-814₄ fixed to a first surface (i.e., substrate 802), actuation electrodes 812₁-812₄ can also be selectively actuated to assist the deflection of movable component 818. For example, as illustrated in FIG. 8A, in addition to actuation electrodes 814₁ and 814₄, actuation electrodes 812₂ and 812₃ can also be actuated to pull movable component 818 toward capacitor plate 822. Under this actuation configuration, actuation electrodes 814₂ and 814₃ can be de-actuated (e.g., grounded) and standoff pivots 816₁-816₄ can pivot movable component 818 away from capacitor plate 824 and towards capacitor plate 822. Similarly, as illustrated in FIG. 8C, in addition to actuation electrodes 814₂ and 814₃, actuation electrodes 812₁ and 812₄ can also be selectively actuated to a high voltage state to deflect movable component 818 towards capacitor plate 824. Under both actuated states (as illustrated in FIGS. 8A and 8C), pivoting around standoff pivots 816₁-816₄ causes an increase of an opening force to bend or deflect movable component 818 between capacitor plates 822 and 824. Accordingly, such configuration can effectively increase a self-actuation voltage $V_{sar}$ of device 800 and stiction due to charging or surface adhesion can be reduced or eliminated.

Figure 9A:
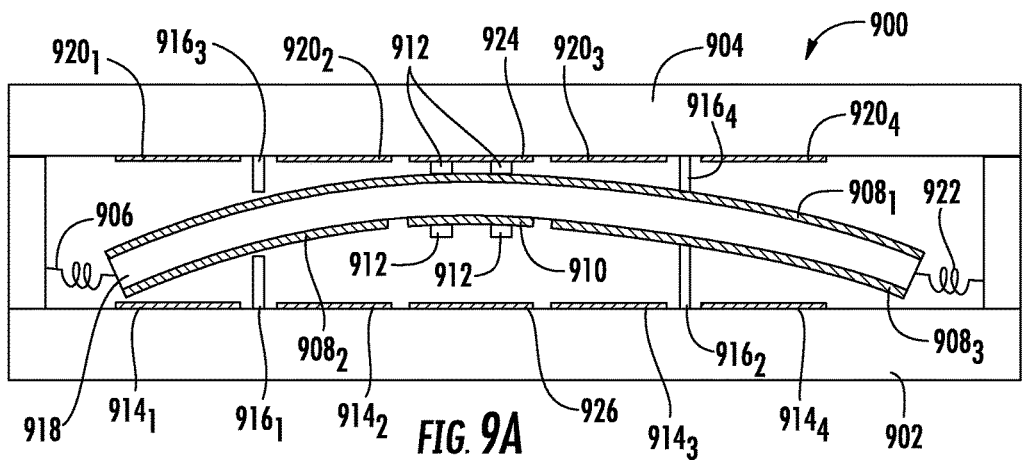
FIG. 9A to 9C are side views of MEMS device comprising one or more standoff pivots and one or more standoff bumps and under various actuated states in accordance to embodiments of the presently disclosed subject matter.
Figure 9B:
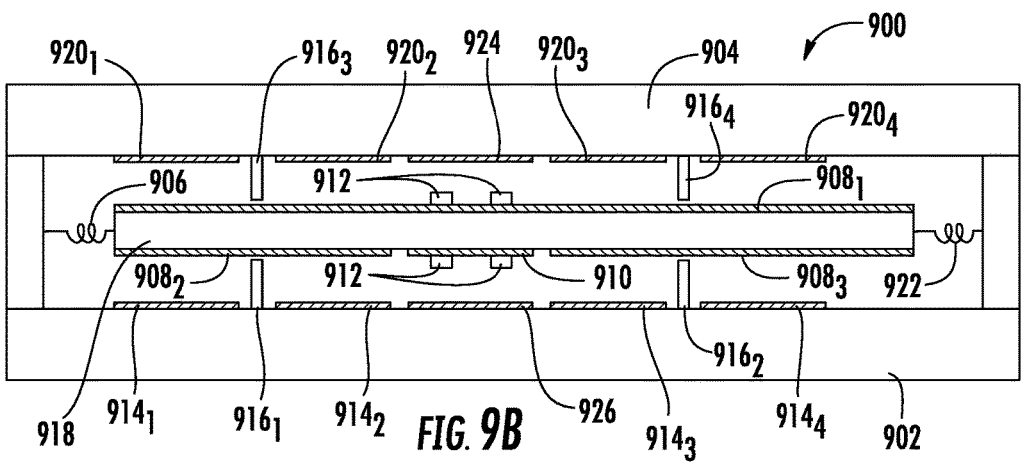
Figure 9C:
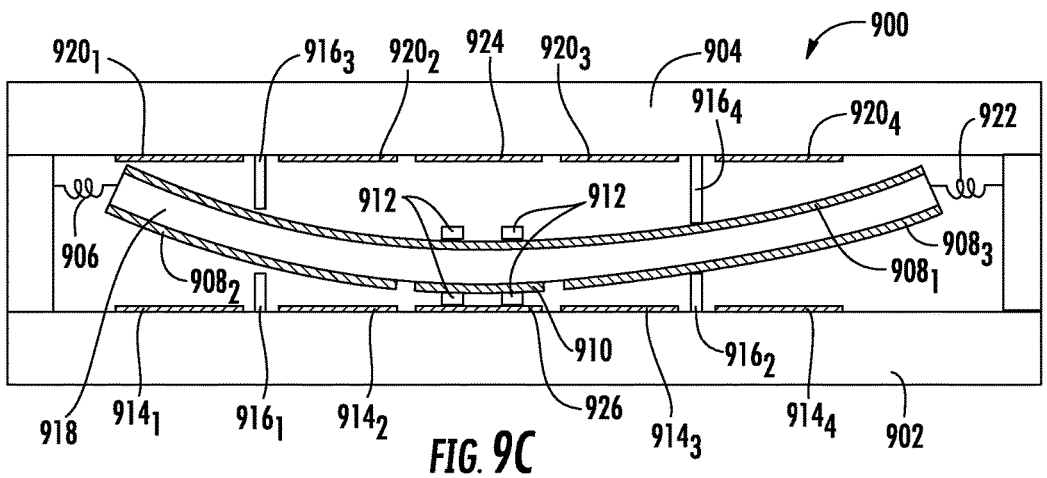

In some embodiments, one or more standoff bumps can be attached to a movable component to further reduce stiction due to charging or surface adhesion. As illustrated in FIGS. 9A to 9C, an eight exemplary configuration of a MEMS device, generally designated 900, is provided. In such a configuration, standoff bumps 912 can be attached to movable component 918. For example, standoff bumps 912 can be fixed to capacitor plate 910 and/or actuation plate 908₁. Furthermore, similar to other embodiments previously presented, a movable component 918 can be positioned between a first surface (i.e., substrate 902) and a second surface (i.e., lid 904) and connected to two fixed anchors by springs 906 and 922. Standoff pivots 916₁ and 916₂ can be fixed to substrate 902 and standoff pivots 916₁ and 916₂ can be fixed to lid 904. In some embodiments, actuation plate 908₁ can be partitioned into multiple segments to include one or more capacitor electrodes. Alternatively, actuation plate 908₁ can be configured to include one or more capacitive electrodes integrated and spaced apart from capacitor plate 924 fixed to a second surface (i.e., lid 904).

As illustrated in FIG. 9B, under a neutral state (i.e., un-actuated or un-biased state), standoff bumps 912 would not come in contact with capacitor plates 924 and 926. However, when actuation electrodes 914₁, 914₄, 920₂, and 920₃ are actuated, movable component 918 can be pulled toward capacitor plate 924. As illustrated in FIG. 9A, standoff bumps 912 fixed to a capacitor region on actuation electrode 908₁ can prevent capacitor plate 924 from come into direct contact with actuation electrode 908₁, thereby reducing or eliminating stiction due to surface adhesion. Similarly, as illustrated in FIG. 9C, standoff bumps 912 fixed to capacitor plate 910 can prevent capacitor plate 926 from come into direct contact with capacitor plate 910, when actuation electrodes 914₂ and 914₃ and actuation electrodes 920₁ and 920₄ are actuated (i.e., high voltage state) and movable component 918 is pulled toward capacitor plate 926. This configuration can advantageously increase a self-actuation voltage $V_{sar}$ for device 900 and stiction due to surface adhesion can be reduced or eliminated.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A micro-electro-mechanical system (MEMS) device comprising:
   a plurality of fixed actuation electrodes attached to a first surface, wherein each of the plurality of actuation electrodes is independently controllable;
   a fixed capacitor plate fixed to the first surface; and
   a movable component spaced apart from the first surface and movable with respect to the first surface, the movable component comprising one or more movable actuation electrodes spaced apart from the plurality of fixed actuation electrodes and a movable capacitor electrode spaced from the fixed capacitor plate;
   a controller in communication with the plurality of actuation electrodes and configured to selectively actuate a first number of the plurality of actuation electrodes during a pull-in phase to deflect the movable component towards the first surface and to de-actuate one or more of the first number of the plurality of actuation electrodes while maintaining the movable component in a deflected position during a hold down phase, wherein a second number of the plurality of actuation electrodes that is less than the first number remains actuated during the hold down phase to adjust a shape of the movable component such that the movable capacitor electrode is optimally flattened to maximize a capacitance between the movable capacitor electrode and the fixed capacitor plate in the hold down phase.

2. The MEMS device of claim 1, wherein the plurality of fixed actuation electrodes are selectively controllable to deflect the movable component relative to the first surface to any of a plurality of positions corresponding to a plurality of capacitance states of the fixed capacitor plate and the movable capacitive electrode.

3. The MEMS device of claim 1 further comprising at least one standoff bump attached to at least one of the plurality of actuation electrodes, wherein the at least one standoff bump is configured to prevent contact between the actuation electrodes and the movable component.

4. The MEMS device of claim 1 further comprising a plurality of independently-controllable voltage drivers each connected to one of the plurality of actuation electrodes.

5. The MEMS device of claim 1 further comprising a second surface spaced apart from the movable component; wherein the movable component is positioned between the first and second surface and is movable toward the first or second surface.

6. The MEMS device of claim 5, comprising one or more standoff pivots attached to one of the first or second surfaces or the movable component, wherein actuation of one or more of the plurality of fixed actuation electrodes positioned on one side of one of the one or more standoff pivot can cause a portion of the movable component on an opposing side of the standoff pivot to deflect away from the first or second surface.

7. The MEMS device of claim 1, wherein the movable component is connected to the first surface by at least one fixed anchor.

8. A method for adjusting a shape of a movable component of a Micro-electro-mechanical system (MEMS) device comprising:
   in a pull-in phase, deflecting a movable component towards a first surface by selectively actuating a first number of a plurality of fixed actuation electrodes using one or more independently controllable voltage driver, wherein the fixed actuation electrodes are independently controllable and attached to the first surface;
   in a hold-down phase, selectively de-actuating one or more of the first number of the plurality of fixed actuation electrodes while maintaining the movable component in a deflected position, wherein a second number of the plurality of fixed actuation electrodes that is less than the first number remain actuated to adjust a shape of the movable component;
   wherein a movable capacitor electrode is attached to the movable component and a fixed capacitor plate is fixed to the first surface; and
   wherein adjusting the shape of the movable component comprises deflecting the movable component into a shape such that the movable capacitor electrode is optimally flattened to maximize a capacitance between the movable capacitor electrode and the fixed capacitor plate in the hold down phase.

9. The method of claim 8, wherein selectively de-actuating at least one of the first number of the plurality of fixed actuation electrodes comprises de-actuating at least one of the plurality of actuation electrodes that is positioned adjacent to the fixed capacitor plate, the at least one of the plurality of actuation electrodes acting as a shield ring for the fixed capacitor plate.

10. The method of claim 8, wherein adjusting the shape of the movable component comprises changing a spacing between the movable capacitor plate and the fixed capacitor plate.

11. The method of claim 8, wherein adjusting the shape of the movable component comprises actuating at least one actuation electrode on one side of a standoff pivot to cause a portion of the movable component on an opposing side of the standoff pivot to deflect away from the first surface.

12. The method of claim 11, actuating at least one actuation electrode on one side of a standoff pivot comprises increasing a self-actuation release voltage between the movable capacitor plate and the fixed capacitor plate for high power hot switching.

* * * * *